(12) United States Patent
Miura et al.

(10) Patent No.: US 6,601,219 B2
(45) Date of Patent: Jul. 29, 2003

(54) ELECTRONIC APPARATUS AND MANUFACTURING METHOD FOR AN ELECTRONIC APPARATUS

(75) Inventors: Hirotsuna Miura, Suwa (JP); Katsumi Tsukada, Suwa (JP); Eiji Nakaya, Suwa (JP); Hiroyuki Hashimoto, Suwa (JP); Yoshimasa Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/990,545

(22) Filed: Nov. 20, 2001

(65) Prior Publication Data

US 2002/0090800 A1 Jul. 11, 2002

(30) Foreign Application Priority Data

Jan. 5, 2001 (JP) ........................................ 2001-000384

(51) Int. Cl.[7] .............................................. G06F 17/50
(52) U.S. Cl. ........................................................ 716/1
(58) Field of Search ............................ 716/1–21; 326/38, 326/39

(56) References Cited

U.S. PATENT DOCUMENTS

| | | | | |
|---|---|---|---|---|
| 5,268,598 A | * | 12/1993 | Pedersen et al. | 326/39 |
| 5,297,056 A | * | 3/1994 | Lee et al. | 716/1 |
| 5,309,046 A | * | 5/1994 | Steele | 326/39 |
| 5,350,954 A | * | 9/1994 | Patel | 326/39 |
| 5,352,940 A | * | 10/1994 | Watson | 326/44 |
| 5,359,242 A | * | 10/1994 | Veenstra | 326/39 |
| 5,444,394 A | * | 8/1995 | Watson et al. | 326/45 |
| 5,764,529 A | * | 6/1998 | Capps et al. | 716/1 |
| 5,815,405 A | * | 9/1998 | Baxter | 716/3 |
| 6,107,824 A | * | 8/2000 | Reddy et al. | 326/41 |
| 6,127,865 A | * | 10/2000 | Jefferson | 327/149 |
| 6,219,824 B1 | * | 4/2001 | Borland | 716/17 |
| 6,477,683 B1 | * | 11/2002 | Killian et al. | 716/1 |

* cited by examiner

*Primary Examiner*—Matthew Smith
*Assistant Examiner*—Andrea Liu
(74) *Attorney, Agent, or Firm*—Mark P. Watson (57) ABSTRACT

To provide an electronic apparatus and electronic apparatus manufacturing method enabling selection of a necessary functional block from among multiple functional blocks or units so that numerous functions can be selectively used with few input/output terminals. An electronic apparatus has input/output terminals 101 for connecting to an external circuit; functional blocks or units 101a to 102c such as DRAM, flash ROM, and an ASIC; a switching circuit 103 that is a two-way analog switch for switching between the functional blocks or units 102a to 102c and input/output terminals 101; and function selection terminals 104 for applying to the switching circuit 103 a signal indicating which functional block of functional blocks or units 102a to 102c to connect to the input/output terminals 101. Because the necessary functional block and the input/output terminals 101 can be connected according to the input to the function selection terminal 104, numerous functions can be selectively used with only a few input/output terminals.

35 Claims, 9 Drawing Sheets

ELECTRONIC APPARATUS AND MANUFACTURING METHOD FOR AN ELECTRONIC APPARATUS

BACKGROUND OF THE INVENTION

1. Field of the Invention

The present invention relates to an electronic apparatus having a plurality of built-in functional blocks or units, and to a manufacturing method for the same.

2. Description of the Related Art

Multiple functional blocks or units have been built into electronic devices such as cards (individual circuit boards) that fit into expansion slots in PCs (personal computers) and integrated circuit (IC) devices. These devices have built-in multiple functional blocks or units such as DRAM (dynamic random access memory), flash ROM (read-only memory), or an ASIC (application specific integrated circuit). In order to use the DRAM or other numerous functions of the IC, card or other device, numerous input/output terminals are required on the IC, card or other device.

OBJECTS OF THE INVENTION

The present invention addresses the problems described above, and an object of this invention is to provide an electronic apparatus whereby only those internally provided functions that are needed can be selectively assigned to input/output terminals, thereby reducing the number of input/output terminals, improving reliability, and maintaining low cost, and to provide a method of manufacturing this electronic apparatus.

SUMMARY OF THE INVENTION

To achieve this object, an electronic apparatus according to a first aspect of the present invention is comprises a connection means or connector for connecting to an external circuit or external device; one or more functional blocks or units for executing a specific function; a switching circuit for selectively connecting a functional block to the connection means or connector; function selection terminals connected to the switching circuit for outputting to the switching circuit a signal specifying which functional block to connect to the connection means; and a signal determination means or unit for determining the signal output from the function selection terminal.

The switching circuit here can be configured to switch the functional block connected to the connection means based on change in an electrical characteristic or optical characteristic between the function selection terminals.

Furthermore, the instruction can be given to the switching circuit by applying to the function selection terminals a member that changes the characteristic between the function selection terminals, and an identification pattern indicating what functional block is connected to the connection means can be written on this member. This member can be a label, and the identification pattern written on the member can be letters or a bar code.

Furthermore, to resolve the above problem, an electronic apparatus according to a second aspect of this invention is comprises a connection means or connector for connecting to an external circuit or external device; one or more functional blocks or units for executing a specific function; a switching circuit for selectively connecting a functional block to the connection means; and a switching data storage means, storage or memory connected to the switching circuit for storing information and for outputting to the switching circuit a signal specifying which functional block to connect to the connection means.

The switching data storage means or memory is preferably rewritable. In addition, the switching data storage means can be Programmable Logic Array (PLA).

Furthermore, to resolve the above problem a method of manufacturing an electronic apparatus according to the first aspect of the invention is characterized by (a) a step for producing one or more functional blocks or units for executing a specific function; (b) a step for producing a connector that connects to an external circuit or external device; (c) a step for producing lines connecting the connector to all functional blocks or units; and (d) a step for cutting the lines connecting the connector to functional blocks or units that are unnecessary.

In this method, step (c) can produce the lines using semiconductor elements, and step (d) cuts the lines by destroying the semiconductor elements.

Furthermore, step (c) can form the lines so that the pattern of lines cut by step (d) forms a readable identification pattern. This identification pattern can be letters or a bar code.

Furthermore, step (d) can cut the lines with a laser.

To resolve the above problems, a manufacturing method for an electronic apparatus according to the second aspect of the invention is characterized by: (a) producing one or more functional blocks or units for executing a specific function; (b) producing a switching circuit that selectively connects a functional block to a connector that connects to an external circuit or external device; (c) producing a phase change unit from a phase change material; (d) producing a phase change detecto connected to the switching circuit for detecting a phase change of the phase change unit and outputting a detection signal to the switching circuit; and (e) changing the phase of the phase change unit so that a required functional block of the functional blocks or units and the connector are connected by the switching circuit.

In this case step (c) can produce the phase change unit from a material that changes from a crystalline phase to an amorphous phase.

In addition, step (e) can change the phase of the phase change unit by laser beam emission, or can change the phase of the phase change unit by a thermal head.

Furthermore, step (c) can make the phase change unit from a material that changes from a crystalline phase to an isotropic liquid phase.

Furthermore, step (c) can make the phase change unit from a material whereby phase change causes a change in dielectric constant; and step (d) produces the phase change detector from electrodes with the phase change unit disposed therebetween, a voltage applying unit that applies a voltage between the electrodes, and a voltage rise detection circuit that detects a voltage rise between the electrodes.

Furthermore, step (c) can produce the phase change unit so that the phase change pattern resulting from step (e) is a readable identification pattern. The identification pattern in this case can be letters or a bar code.

By selectively connecting a plurality of functional blocks or units to a connector and selecting the connections so that the necessary functional blocks or units are connected to the connector, numerous functions can be selectively used with few connections to an external device.

DESCRIPTION OF THE PREFERRED EMBODIMENTS

An electronic apparatus and an electronic apparatus manufacturing method according to the present invention are described in detail below with reference to the accompanying figures.

Figure 1:
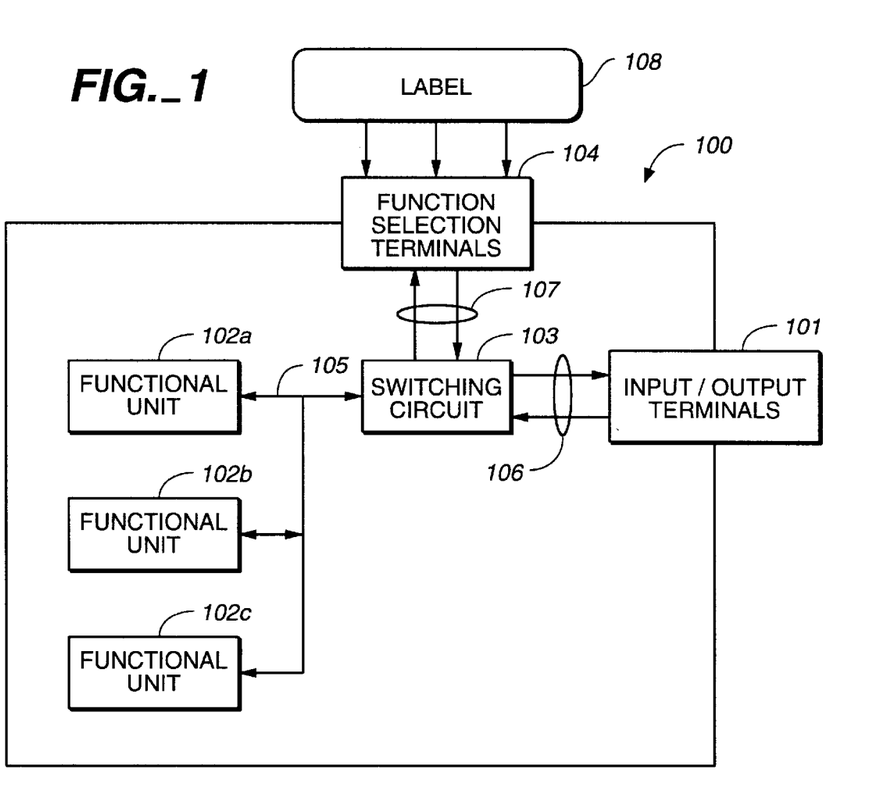
FIG. 1 is a block diagram of a preferred embodiment of an electronic apparatus according to the present invention.

FIG. 1 shows an exemplary configuration applying the present invention to an electronic apparatus, specifically an IC device in this exemplary embodiment. In FIG. 1 an IC device 100 according to the present invention has input/output terminals 101 for connecting to an external circuit, plural functional blocks such as RAM (or DRAM), flash ROM, and an ASIC (shown in FIG. 1 as functional blocks or units 102a to 102c), switching circuit 103, which is a two-way analog switch for switching the connection between the functional blocks or units 102a to 102c and input/output terminals 101, and function selection terminals 104 for applying to the switching input of the switching circuit 103 a signal indicating which functional blocks or units of functional blocks or units 102a to 102c to connect to the input/output terminals 101.

Signal lines 106 connect the input/output terminals 101 and switching circuit 103. The functional blocks or units 102a to 102c and switching circuit 103 are connected by signal line 105. The function selection terminals 104 are connected by signal lines 107 to the switching circuit 103.

A label 108 establishing conductivity between the function selection terminals 104 determines the signals that flow from the function selection terminals 104 to the switching circuit 103. Label 108 is applied to the outside surface of the IC device 100. Label 108 can also establish other electrical characteristics between the function selection terminals 104 such as capacitance or resistance, or can establish or change optical characteristics between the function selection terminals 104 such as reflectivity or refractive index. For ease of understanding, the following discussion will use the example of conductivity.

The label 108 is the signal determination means or signal determination unit in this embodiment. The switching circuit 103 detects the signal indicating the conductivity state of the function selection terminals 104 on signal lines 107. Based on the conductivity state indicated by this signal, switching circuit 103 determines which functional block 102a to 102c to connect to the input/output terminals 101 by way of signal line 105 and signal lines 106.

Figure 2:
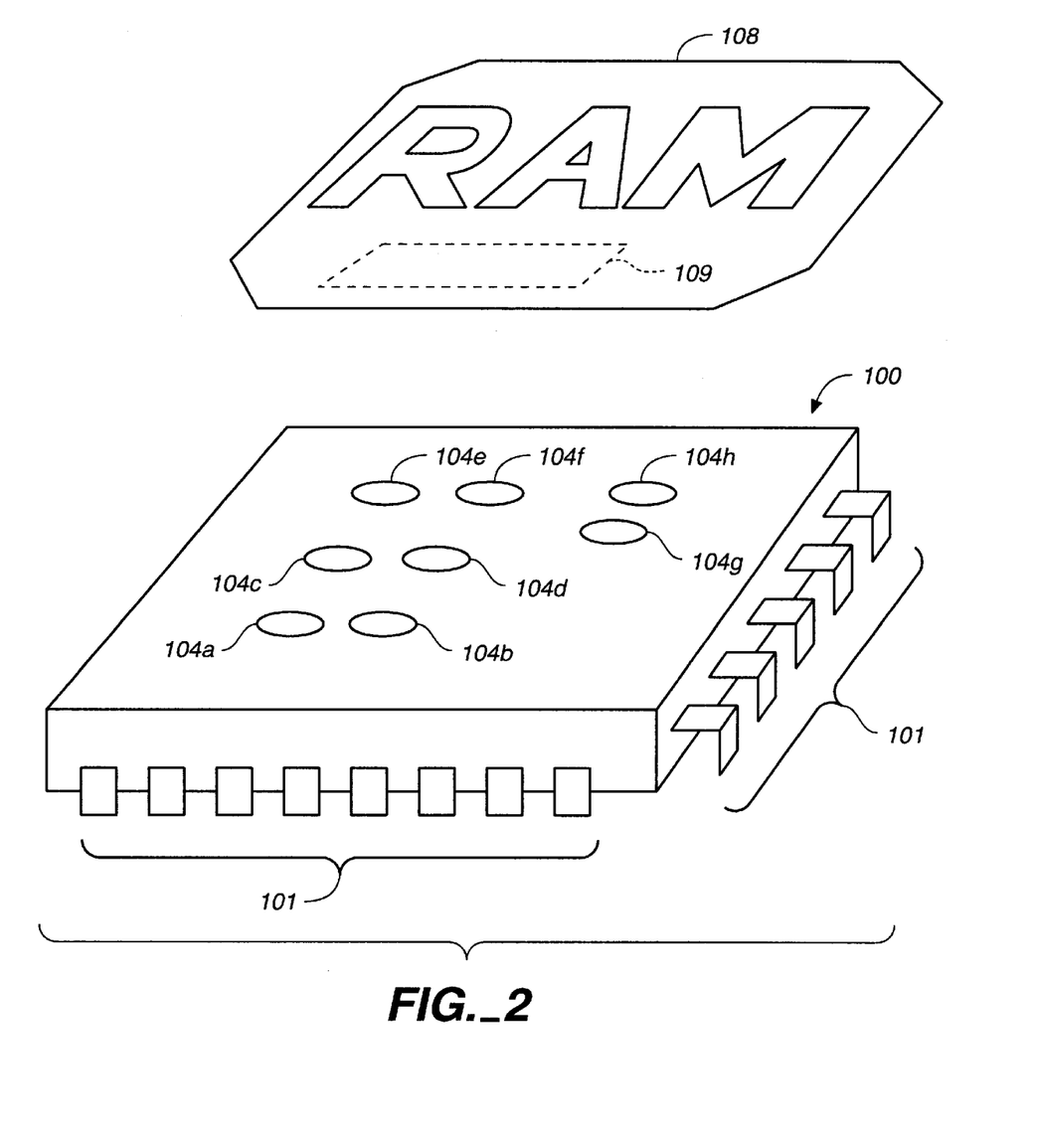
FIG. 2 shows the external appearance of a preferred embodiment of an electronic apparatus according to the present invention.

FIG. 2 shows the connectivity relationship between the IC device 100 and label 108. As shown in FIG. 2 the input/output terminals 101 are arrayed on the sides of the IC device 100. The function selection terminals 104a to 104h are arranged on the top surface of the IC device 100.

The operation of the present invention is described below with reference to FIG. 1 and FIG. 2.

The label 108 is applied to the top of the IC device 100 where the function selection terminals 104a to 104h are arrayed. A conductive material 109 is disposed on the side of the label 108 that adheres to the IC device 100 (the back of the label 108 as seen in FIG. 2) in order to establish conductivity between certain function selection terminals 104a to 104h of the IC device 100 (to establish conductivity between function selection terminal 104a and function selection terminal 104b in FIG. 2). When conductivity between function selection terminal 104a and function selection terminal 104b is established by the conductive material 109 of label 108 with the IC device 100 according to this embodiment shown in FIG. 2, a function selection signal corresponding to this conductivity state is sent via signal lines 107 to the switching circuit 103. This function selection signal thus causes the RAM functional block (functional block 102a) of the functional blocks or units 102a to 102c to be connected by the switching circuit 103 to the input/output terminals 101. The IC device 100 thus functions as a RAM chip.

To indicate that the IC device 100 to which this label 108 is applied functions as a RAM chip, the letters "RAM" are printed on the non-adhesive side of the label 108 (that is, the exposed, upper surface of the label 108 in FIG. 2).

By thus selectively establishing conductivity between function selection terminals 104a to 104h, the IC device 100 of this invention can connect the required functional blocks or units of the functional blocks or units 102a to 102c to the input/output terminals 101, and multiple functions can be selectively used with few input/output terminals 101. Furthermore, which functional block or unit 102a to 102c is used can be switched as needed by applying a label 108 having a conductive material 109 with a different function selection terminal 104a to 104h conductivity pattern to the top of the IC device 100.

Furthermore, which functional of the IC device 100 is selected can be easily identified by printing the name of the functional selected by the pattern of the conductive material 109 on the non-adhesive side of the label 108. Yet further, because the printing on label 108 matches the functional of the IC device 100, applying a separate label 108 printed with a functional name different from the selected functional of the IC device 100, and mistaking the functional of the IC device 100, can be prevented.

Yet further, the functional of the IC device 100 can be switched with the IC device 100 still mounted on the substrate and without requiring any special circuitry by simply changing the label 108. It is therefore possible to reduce the overall cost of the product using the IC device 100 and make maintenance easier.

While one embodiment of an electronic apparatus according to the present invention is described above, it will be noted that, using different labels 108, the functional blocks or units 102a to 102c can be selected using capacitance or resistance rather than conductivity between function selection terminals 104. Yet further, the functional blocks or units 102a to 102c can also be selected using an optical characteristic such as reflectivity or refractive index rather than an electrical characteristic of the function selection terminals 104. In addition, plural functional blocks or units can be connected to the input/output terminals 101 instead of just one functional block.

Figure 3:
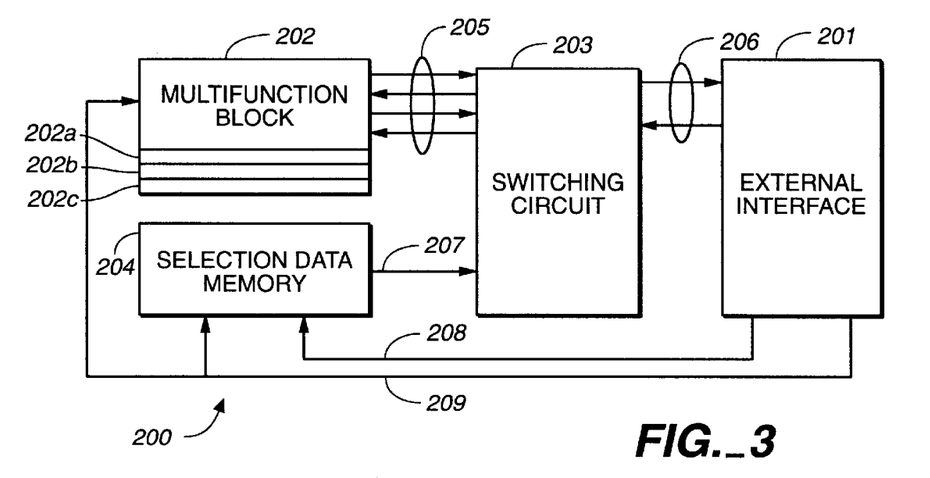
FIG. 3 is a block diagram of another preferred embodiment of an electronic apparatus according to the present invention.

A second preferred embodiment of the present invention is described next. FIG. 3 shows an exemplary configuration applying the present invention to an electronic apparatus, specifically a PC card, i.e. an individual circuit board that fits into an expansion slot in a PC, for example In FIG. 3 a card 200 according to the present invention has an external interface 201 for connecting to an external circuit, a multifunctional block 202 containing plural functional blocks or units such as DRAM, flash memory, and an ASIC (shown in FIG. 3 as functional blocks or units 202a to 202c), switching circuit 203, which is a two-way analog switch for switching connections between one of the functional blocks or units 202a to 202c in the multifunctional block 202 and external interface 201, and selection data memory 204 for storing information indicating to the switching circuit 203 which functional block 202a to 202c in the multifunctional block 202 to connect to the external interface 201.

The external interface 201 and switching circuit 203 are connected by signal lines 206. The functional blocks or units 202a to 202c in the multifunctional block 202 and the switching circuit 203 are connected by signal lines 205. Output from the selection data memory 204 is connected to the switching circuit 203 by signal line 207.

The switching circuit 203 receives the output signal from the selection data memory 204 through signal line 207, and based on this signal connects a functional block 202a to 202c in the multifunctional block 202 to the external interface 201 through signal lines 205 and 206.

Operation of this PC card 200 is described next.

The PC card 200 starts operating when the power to the device in which the PC card 200 is installed is turned on. When PC card 200 operation starts, the external interface 201 receives a data signal from an external circuit (not shown in the figure) indicating which functional block 202a to 202c in the multifunctional block 202 to use. The data signal indicating which functional block 202a to 202c in multifunctional block 202 to use is sent from the external interface 201 via signal line 208 to selection data memory 204. When the selection data memory 204 receives the data signal indicating which functional block 202a to 202c in multifunctional block 202 to use, it internally stores the data. As a result, data indicating which functional block 202a to 202c in multifunctional block 202 to use is stored by the selection data memory 204.

Next, the external interface 201 receives an initialization signal from the external circuit. The initialization signal is sent from external interface 201 via signal line 209 to the selection data memory 204 and multifunctional block 202.

When the multifunctional block 202 receives the initialization signal, it initializes the internal functional blocks or units 202a to 202c and starts functional block 202a to 202c operation.

When the selection data memory 204 receives the initialization signal, it sends a signal to the switching circuit 203 via signal line 207 indicating which functional block 202a to 202c in multifunctional block 202 to use.

When the switching circuit 203 receives from the selection data memory 204 via signal line 207 the signal indicating which functional block 202a to 202c in multifunctional block 202 to use, it connects the corresponding functional block 202a to 202c to the external interface 201.

By thus writing a signal indicating which functional block 202a to 202c in multifunctional block 202 to use to the selection data memory 204, a PC card 200 according to the present invention connects the necessary functional blocks or units of the functional blocks or units 202a to 202c in the multifunctional block 202 to the external interface 201 and thus enables multiple functions to be selectively used with fewer external interfaces 201. It is also possible to change, as necessary, which functional block 202a to 202c in multifunctional block 202 is used by rewriting the data stored in selection data memory 204.

A preferred embodiment of an electronic apparatus according to the present invention is described above, and it will be noted that a PLA (programmable logic array), for example, can be used for the selection data memory 204.

Figure 4:
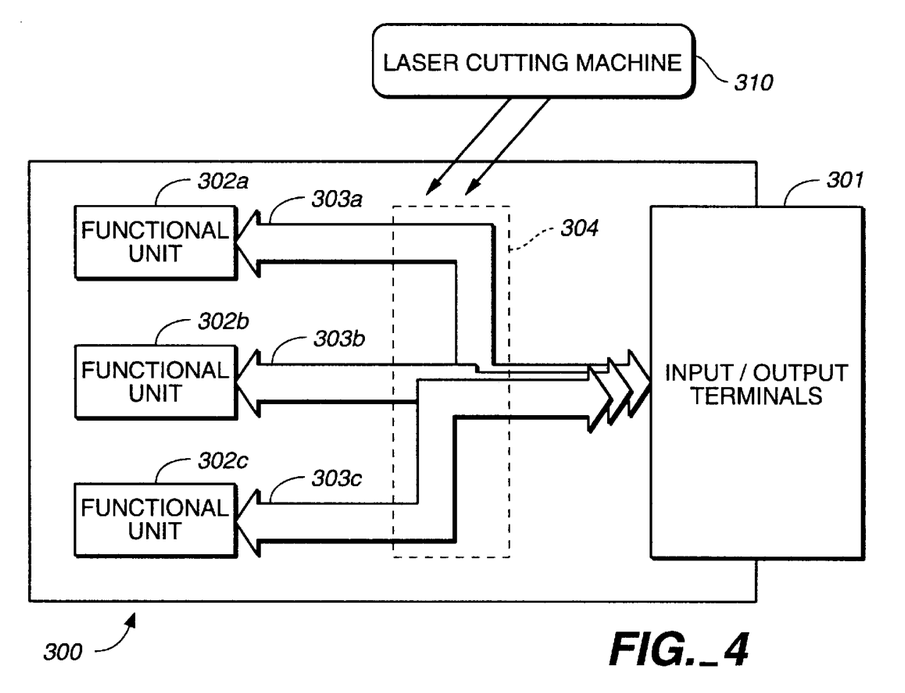
FIG. 4 is a block diagram of another preferred embodiment of an electronic apparatus according to the present invention.

A third embodiment of the present invention is described next. FIG. 4 shows an exemplary configuration applying the present invention to an electronic apparatus, specifically an IC device. In FIG. 4 an IC device 300 according to the present invention has input/output terminals 301 for connecting to an external circuit, plural functional blocks or units such as DRAM, flash ROM, and an ASIC (shown in FIG. 4 as functional blocks or units 302a to 302c), and aluminum lines (shown as aluminum lines 303a to 303c in FIG. 4) for connecting the input/output terminals 301 to each of the functional blocks or units 302a to 302c.

This IC device 300 is a chip that functions as one of functional blocks or units 302a to 302c. In this example described below IC device 300 is a chip that functions as functional block 302b.

Figure 7:
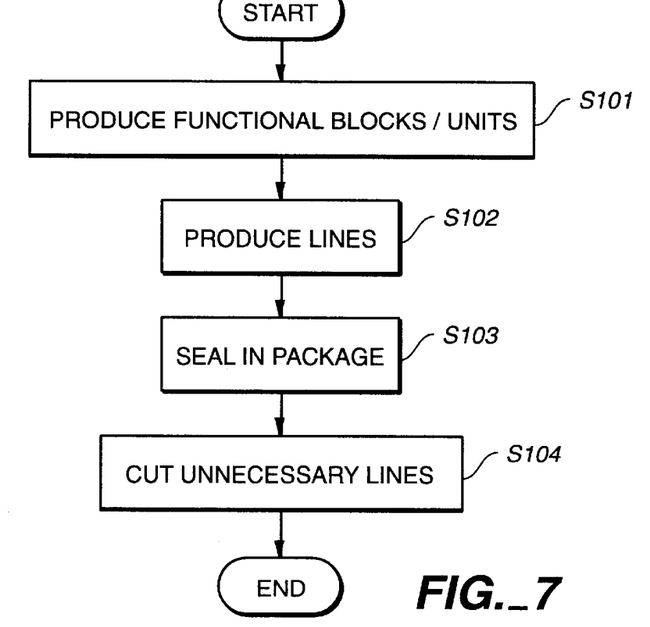
FIG. 7 is a flow chart showing a preferred embodiment of an electronic apparatus manufacturing method according to the present invention.

FIG. 7 is a flow chart of a method for manufacturing this IC device 300. Manufacturing this IC device 300 is described next below with reference to FIG. 7.

First, the functional blocks or units 302a to 302c are produced on a silicon wafer (step S101).

Aluminum line 303a connecting input/output terminals 301 and functional block 302a, aluminum line 303b connecting the input/output terminals 301 and functional block 302b, and aluminum line 303c connecting the input/output terminals 301 and functional block 302c, are produced next. The aluminum lines 303a to 303c are laid out so that they pass through line cutting area 304 (step S102).

The silicon wafer is then diced and sealed in a package having the input/output terminals 301i (step S103). The aluminum lines 303a to 303c are then bonded to the input/output terminals 301 (also in step S103).

The aluminum lines 303a to 303c connecting the input/output terminals 301 to the functional blocks or units 302a to 302c that are not needed are then cut in the line cutting area 304 using a laser beam from a laser cutting machine 310 (step S104). The example IC device 300 according to the embodiment shown in FIG. 4 is a chip that functions as functional block 302b. Therefore, the two aluminum lines 303a and 303c are cut in step S104, leaving intact aluminum line 303b connecting functional block 302b to input/output terminals 301.

It is therefore possible as described above to manufacture an IC device 300 as a chip that performs the functions of functional block 302b.

As described above, it is possible to leave only the aluminum line 303b connecting the required functional block 302b to the input/output terminals 301 by cutting the aluminum lines 303a and 303c connecting the unnecessary functional blocks or units 303a and 303c to the input/output terminals 301. It is thereby possible to selectively use numerous functions with few input/output terminals 301.

Cutting the aluminum lines is described in detail next below in connection with FIGS. 5 and 6.

Figure 5:
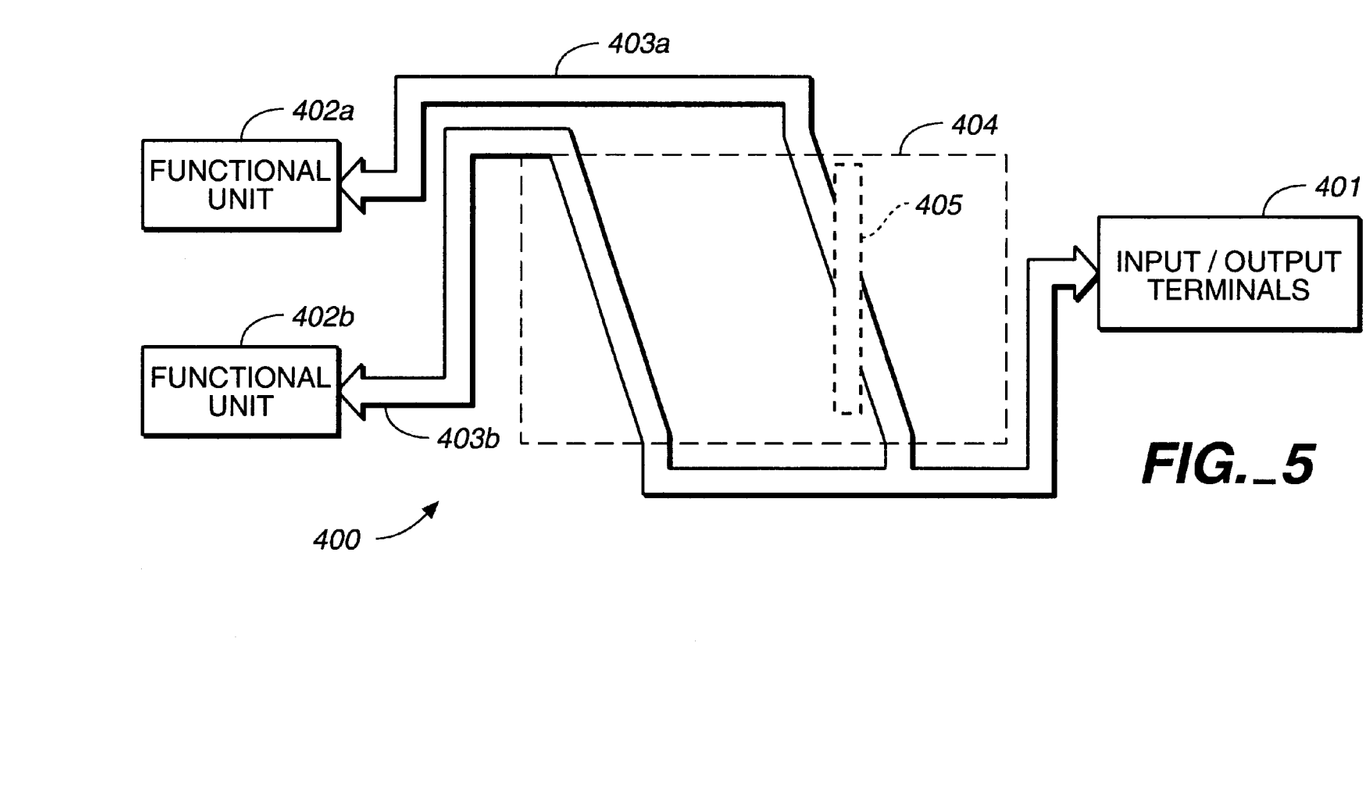
FIG. 5 is a block diagram of another preferred embodiment of an electronic apparatus according to the present invention.

FIG. 5 shows an exemplary configuration applying the present invention to an electronic apparatus, specifically an IC device. In FIG. 5 an IC device 400 according to the present invention has input/output terminals 401 for connecting to an external circuit, plural functional blocks or units such as DRAM, flash ROM, and an ASIC (shown in FIG. 5 as functional blocks or units 402a and 402b), and aluminum lines (shown as aluminum lines 403a and 403b in FIG. 5) for connecting the input/output terminals 401 to the functional blocks or units 402a and 402b. The aluminum lines 403a and 403b are laid out so that they pass through line cutting area 404.

Input/output terminals 401 are connected by aluminum line 403a to functional block 402a, and by aluminum line 403b to functional block 402b.

In FIG. 5 aluminum line 403a is laid out through the line cutting area 404 to connect functional block 402a and input/output terminals 401. Likewise, aluminum line 403b is laid out through the line cutting area 404 to connect functional block 402b and input/output terminals 401.

If, for example, the required functional block is functional block 402b, the laser is emitted to area 405 where the aluminum line 403a passes through the line cutting area 404, and the aluminum line 403a is cut. The aluminum line 403b connecting functional block 402b and input/output terminals 401 thus remains intact.

By thus cutting aluminum line 403a, only aluminum line 403b connecting functional block 402b and input/output terminals 401 is present, and an IC device 400 performing the functions of functional block 402b can be manufactured.

It is therefore possible, by cutting aluminum line 403a connecting unnecessary functional block 402a and input/output terminals 401, to leave only aluminum line 403b connecting required functional block 402b and input/output terminals 401, and thus selectively use multiple functions with fewer input/output terminals 401.

Figure 6:
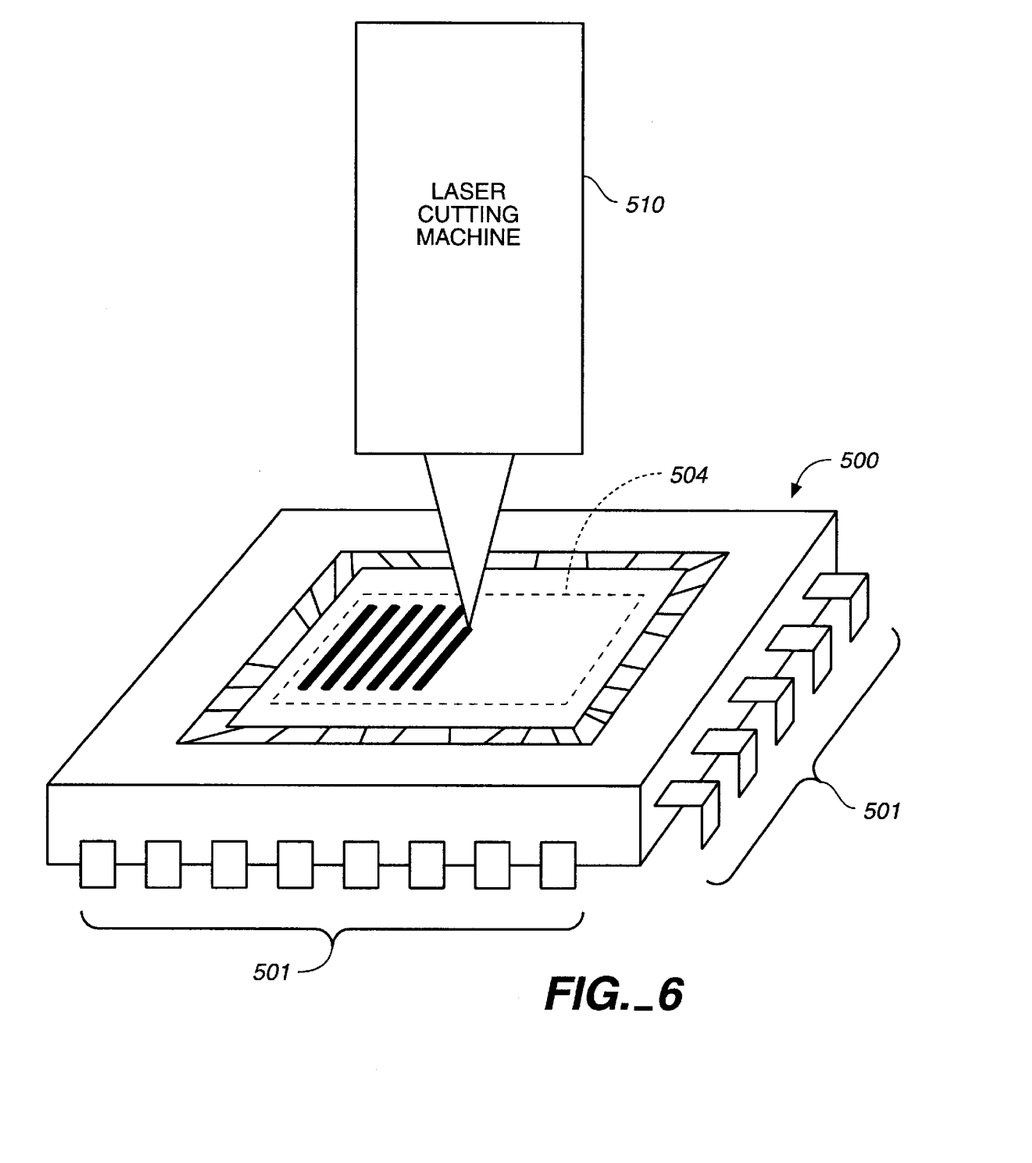
FIG. 6 shows the external appearance of another preferred embodiment of an electronic apparatus according to the present invention.

FIG. 6 shows the cutting of aluminum lines in an electronic apparatus of the present invention, specifically IC device 500. In FIG. 6 the input/output terminals 501 are arrayed on the sides of the IC device 500. An opening is provided in the top surface of the IC device 500. Plural functional blocks or units (not shown in the figure) are provided inside the package of the IC device 500. The line cutting area 504, through which pass the aluminum lines connecting the functional blocks or units and the input/output terminals 501, is disposed in the opening at the top of the package.

The laser beam is emitted from the laser-cutting machine 510 to the line cutting area 504 through this opening in the top of the IC device 500. This laser beam cuts aluminum lines that connect unnecessary functional blocks or units with the input/output terminals 501. An IC device 500 can thus be manufactured as a chip providing required functions by cutting the aluminum lines connecting unnecessary functional blocks or units and the input/output terminals 501 so that only aluminum lines connecting the input/output terminals 501 to the required functional blocks or units remain.

It will be noted that the aluminum lines are laid out in this IC device 500 so that the traces of the laser beams emitted to cut the aluminum lines look like a bar code. As a result, this bar code makes it possible to easily know which lines were cut, that is, what function the IC device 500 performs.

It is therefore possible to selectively use multiple functions with few input/output terminals 501 by cutting lines connecting unnecessary functional blocks or units with the input/output terminals 501 so that only lines connecting required functional blocks or units to the input/output terminals 501 remain. In addition, by laying out the lines so that the traces of the laser beams cutting the lines form a bar code identifying the function, the function performed by the IC device can be easily identified.

An electronic apparatus and electronic apparatus manufacturing method according to the present invention are described above. It will be noted, however, that a semiconductor element can be used instead of aluminum to connect functional blocks or units and input/output terminals, and that the connection between the input/output terminals and unnecessary functional block can be cut by destroying the semiconductor element.

It should also be noted that the lines can be laid out so that instead of a bar code the traces of the laser beam for cutting the lines form a letter.

Figure 8:
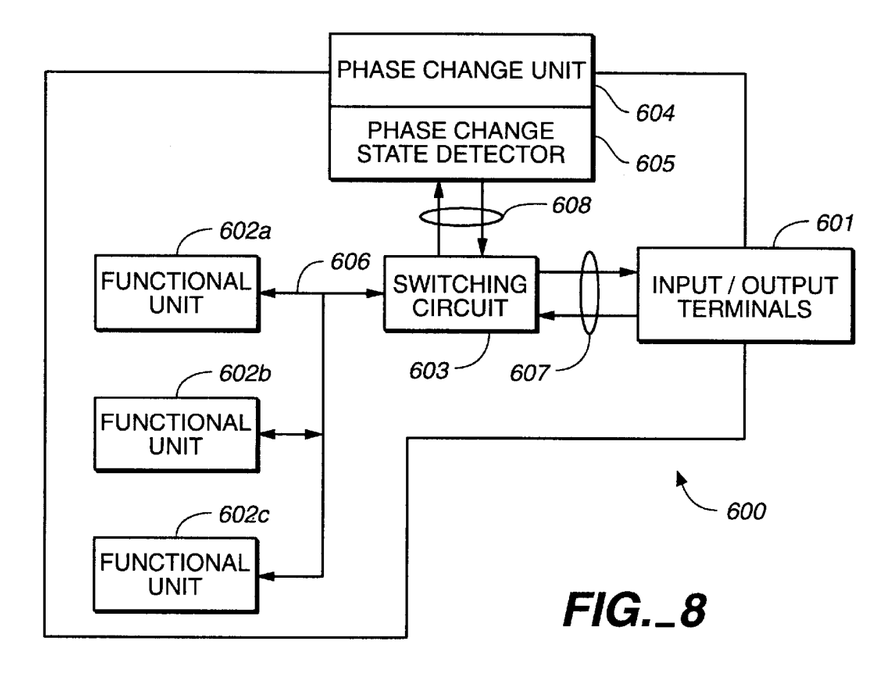
FIG. 8 is a block diagram of another preferred embodiment of an electronic apparatus according to the present invention.

A fourth embodiment of the present invention is described next. FIG. 8 shows an exemplary configuration applying the present invention to an electronic apparatus, specifically an IC device. In FIG. 8 an IC device 600 according to the present invention has input/output terminals 601 for connecting to an external circuit, plural functional blocks or units such as DRAM, flash ROM, and an ASIC (shown in FIG. 8 as functional blocks or units 602a to 602c), switching circuit 603, which is a two-way analog switch for switching the connection between the functional blocks or units 602a to 602c and input/output terminals 601, phase change unit 604 made from a phase change material that changes phase between crystalline and amorphous states when exposed to a laser beam, and a phase change state detector 605 for detecting the phase change of the phase change unit 604 and notifying the switching circuit 603.

Signal lines 607 connect the input/output terminals 601 and switching circuit 603. The functional blocks or units 602a to 602c and switching circuit 603 are connected by signal line 606. Signal lines 608 connect the phase change state detector 605 to the switching circuit 603.

The switching circuit 603 receives a signal indicating the phase change state of the phase change unit 604 from the phase change state detector 605 via signal lines 608. Based on this phase change state signal, the switching circuit 603 connects one of the functional blocks or units 602a to 602c to the input/output terminals 601 by way of signal lines 606 and 607.

The phase change unit 604 can be a phase change material that can be changed between crystalline and amorphous phases using a thermal head instead of by laser emission.

Figure 12:
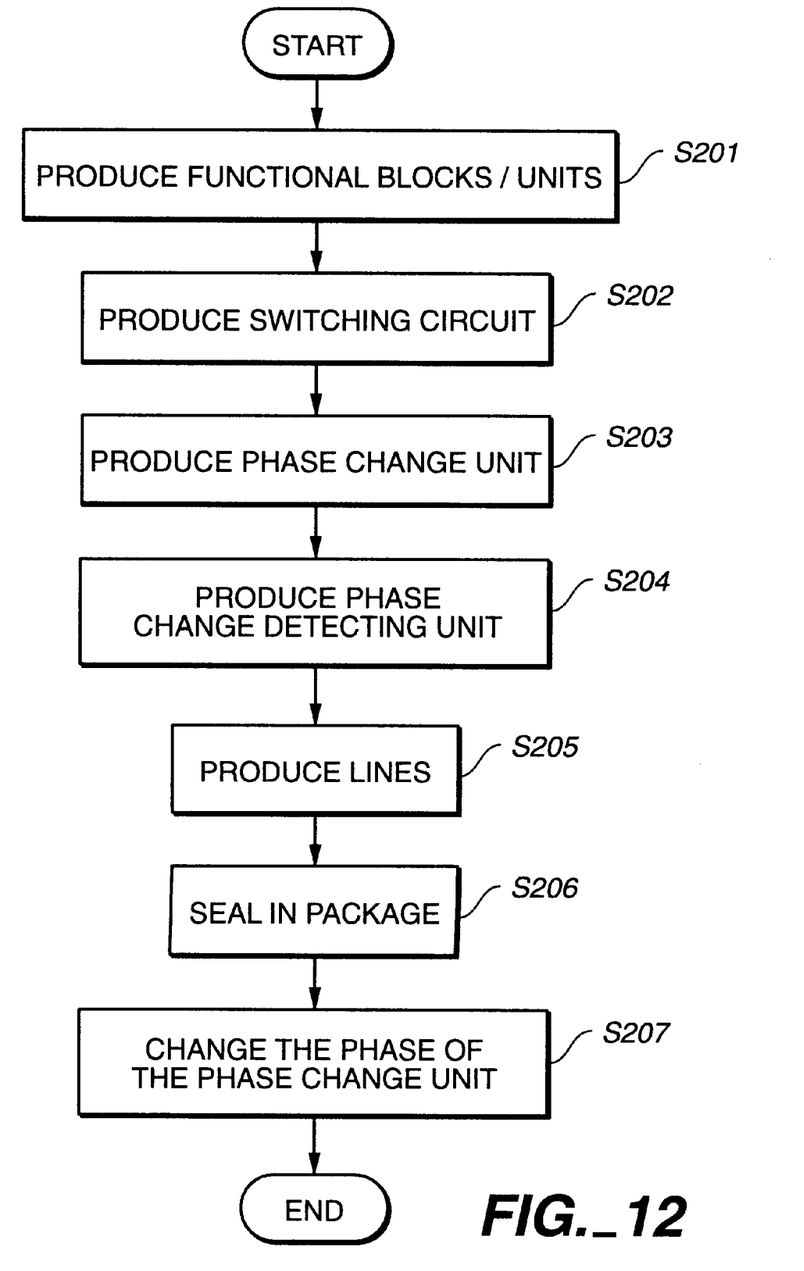
FIG. 12 is a flow chart showing another preferred embodiment of an electronic apparatus manufacturing method according to the present invention.

FIG. 12 is a flow chart of a method for manufacturing an IC device 600 according to the present invention. The manufacturing method of this IC device 600 is described next using FIG. 12.

First, the functional blocks or units 602a to 602c are made on a silicon wafer (step S201).

The switching circuit 603 is formed next on the silicon wafer (step S202).

The phase change unit 604 is then formed on the silicon wafer (step S203).

The phase change state detector 605 is then formed on the silicon wafer (step S204).

Next, the signal line 606 connecting the functional blocks or units 602a to 602c and switching circuit 603, the signal lines 607 connecting the input/output terminals 601 and the functional blocks or units 602a to 602c, and the signal lines 608 connecting the switching circuit 603 and phase change state detector 605, are formed (step S205).

Next, in step S206, the silicon wafer is diced and sealed in a package having the input/output terminals 601. The signal lines 607 are then bonded to the input/output terminals 601 (also in step S206).

The phase of the phase change unit 604 is then changed by emitting a laser beam to the phase change unit 604 so that the required functional blocks or units of the functional blocks or units 602a to 602c and the input/output terminals 601 are connected by the switching circuit 603 (step S207).

It is thus possible to manufacture an IC device 600 performing a required function by connecting the required functional blocks or units of functional blocks or units 602a to 602c to the input/output terminals 601.

Figure 9:
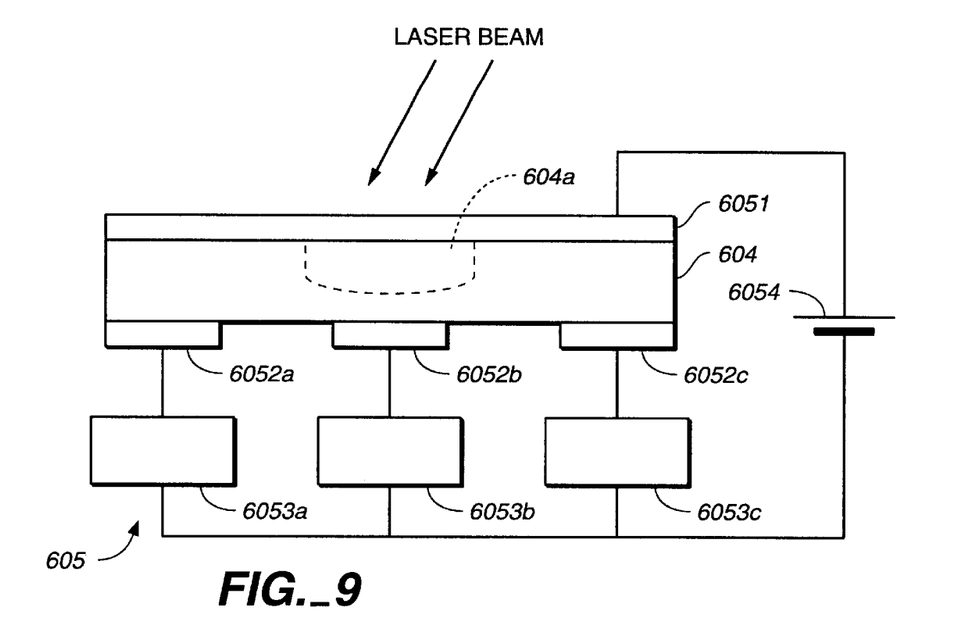
FIG. 9 is a block diagram of another preferred embodiment of an electronic apparatus according to the present invention.

The phase change unit 604 and phase change state detector 605 are described in further detail next. FIG. 9 shows the configuration of the phase change unit 604 and phase change state detector 605. In FIG. 9 the phase change unit 604 is a flat phase change member. This phase change member changes between crystalline and amorphous phases when exposed to a laser. A flat transparent electrode 6051 is disposed on top of the phase change unit 604. Electrodes 6052a to 6052c are disposed on the bottom of the phase change unit 604. A capacitor is thus formed by disposing the phase change unit 604 between electrode 6051 and electrodes 6052a to 6052c. A voltage is then applied by power supply 6054 between electrode 6051 and electrodes 6052a to 6052c. Voltage comparators 6053a to 6053c are disposed respectively between electrodes 6052a to 6052c and power supply 6054. Electrode 6051, electrodes 6052a to 6052c, voltage comparators 6053a to 6053c, and power supply 6054 form the phase change state detector 605.

A laser beam is then emitted to the area 604a in phase change unit 604 between electrode 6051 and electrode 6052b. The phase change material in this area 604a of phase change unit 604 changes from a crystalline phase to an amorphous phase due to laser beam exposure.

Figure 10:
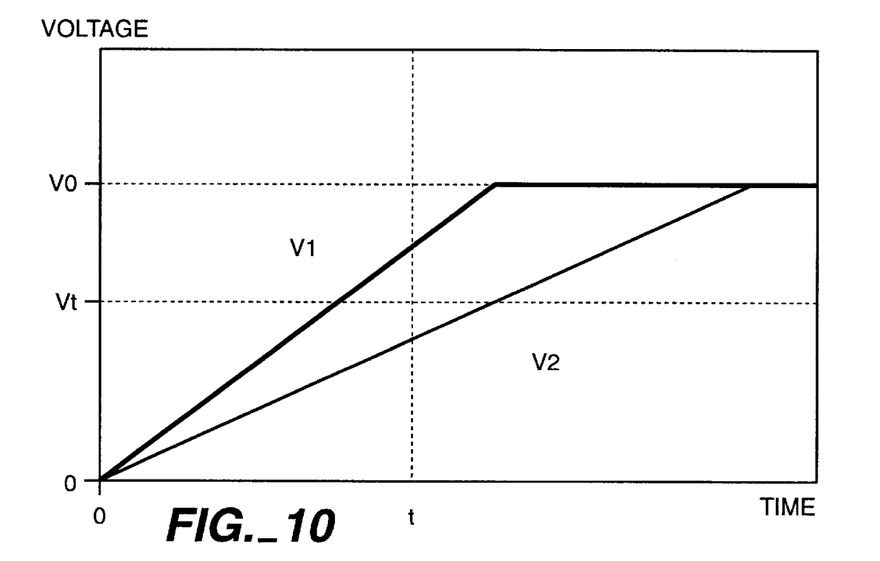
FIG. 10 shows the voltage change between the electrodes of FIG. 9.

When the phase change material of the phase change unit 604 changes phase from crystalline to amorphous, the dielectric constant drops. The voltage rise between electrode 6051 and electrode 6052b having the phase-changed area 604a disposed therebetween thus becomes faster than the voltage rise between electrode 6051 and electrode 6052a and between electrode 6051 and electrode 6052c. FIG. 10 is a graph comparing the rise in voltage V1 between electrode 6051 and electrode 6052b, and voltage V2 between electrode 6051 and electrode 6052c, from when voltage is first applied to supply voltage V0. As shown in FIG. 10, voltage V1 between electrode 6051 and electrode 6052b rises to supply voltage V0 faster than voltage V2 between electrode 6051 and electrode 6052c.

It is therefore possible to detect the phase change of phase change unit 604 by means of voltage comparators 6053a to 6053c comparing the voltages between electrodes a specific time after a voltage is applied by power supply 6054 between electrode 6051 and electrodes 6052a to 6052c.

By thus inputting to switching circuit 603 via signal lines 608 a signal detected by phase change state detector 605 indicating the phase change state of the phase change unit 604, the required functional block of functional blocks or units 602a to 602c is connected to the input/output terminals 601, and the IC device 600 can perform the functions of the required functional block of functional blocks or units 602a to 602c.

Figure 11:
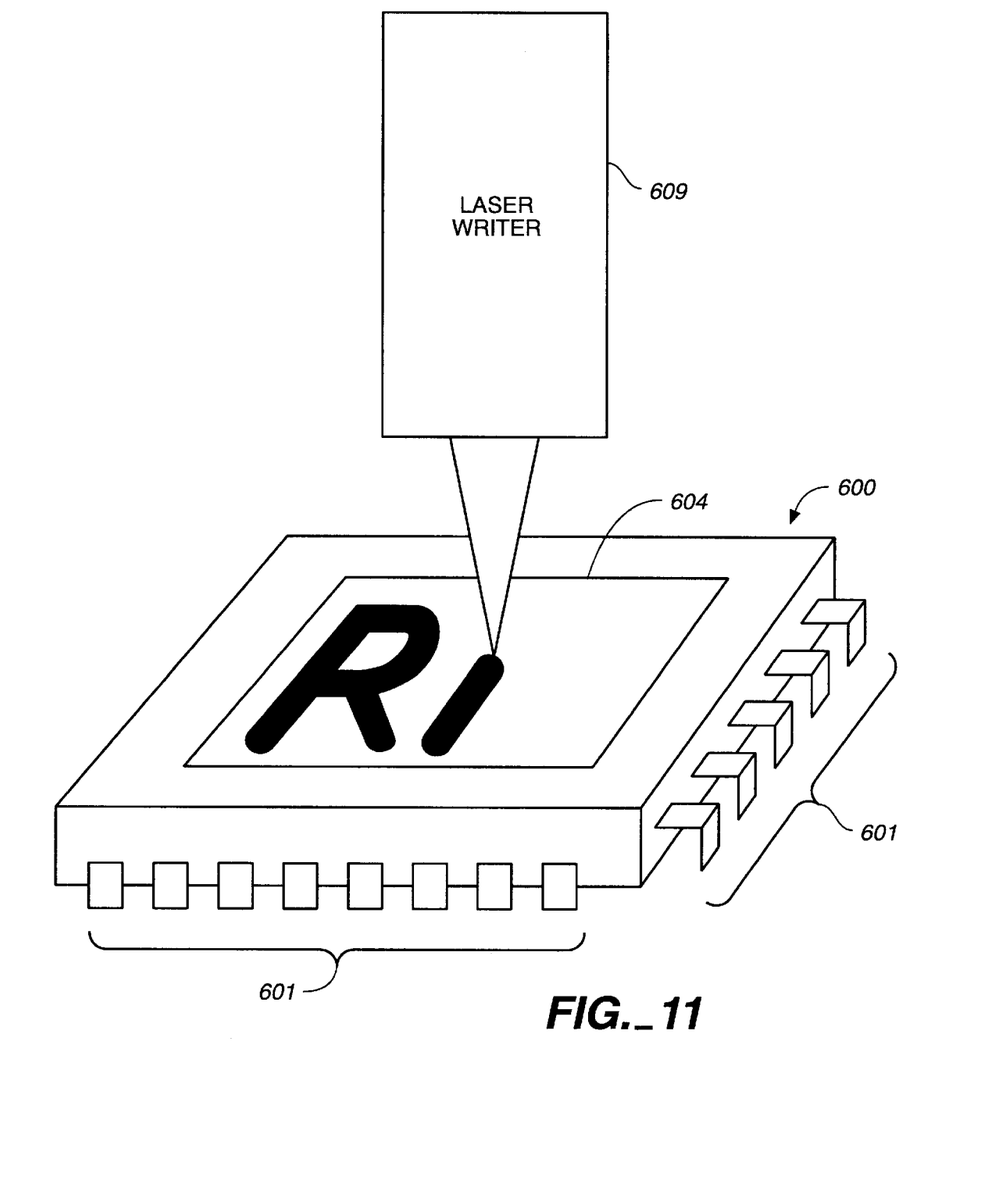
FIG. 11 shows the configuration of another preferred embodiment of an electronic apparatus according to the present invention.

FIG. 11 shows changing the phase of the phase change unit 604 in IC device 600. The input/output terminals 601 are arrayed along the sides of the IC device 600 in FIG. 11. There is an opening in the top of the IC device 600. The phase change unit 604 is placed in this opening in the top of the package, and is covered by the transparent electrode 6051. A laser beam emitted from a writer 609 to the phase change unit 604 changes the phase of the phase change unit 604.

The reflectivity of the phase change unit 604 changes when the phase change material changes from crystalline to amorphous phase. This is used in this IC device 600 to lay out the electrodes so that the part of the phase change unit 604 where the reflectivity changes due to the phase change forms letters indicating the functional block selected by the phase change. It is therefore possible to easily know what functional block of the IC device 600 is connected to the input/output terminals 601, that is, the function of the IC device 600, by reading letters appearing on the phase change unit 604 after the phase is changed according to the electrodes.

An IC device 600 according to the present invention can thus connect the required functional blocks or units of functional blocks or units 602a to 602c to input/output terminals 601 so that multiple functions can be selectively used with few input/output terminals. In addition, by arranging the electrodes to form letters indicating the selected functional block, it can be easily known what function the IC device 600 performs by reading the letters on the phase change unit 604 after the phase changes according to the electrodes.

A preferred embodiment of an electronic apparatus and an electronic apparatus manufacturing method according to the present invention is described above, but it will be noted that the phase change unit 604 can be a material that changes from a crystalline phase to an isotropic liquid phase rather than a material that changes from a crystalline phase to amorphous phase. In addition, the electrodes for connecting the input/output terminals 601 and required functional blocks or units can be arranged to form a bar code instead of letters. Yet further, the phase change state detector 605 can be configured to detect resistance, permeability, refractive index, transmittance, reflectivity, polarization, change in color, specific heat, hardness, or other physical property instead of the dielectric constant of the phase change unit 604.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. An electronic apparatus comprising:
a connection means for connecting to an external device;
a plurality of functional units, each of which executes at least one particular function;
a switching circuit that selectively connects at least one of the plurality of functional units to the connection means;
function selection terminals connected to the switching circuit, the function selection terminals outputting to the switching circuit a signal specifying the at least one functional unit to be connected to the connection means; and
a signal determination means for determining the signal that is output from the function selection terminals; and
wherein the signal specifying to the switching circuit the functional unit to be connected to the connection means is generated according to a change in an electrical characteristic between the function selection terminals.

2. An electronic apparatus as in claim 1, wherein the signal specifying to the switching circuit the functional unit to be connected to the connection means is generated according to conductivity between the function selection terminals.

3. An electronic apparatus as in claim 1, wherein the signal specifying to the switching circuit the functional unit to be connected to the connection means is generated according to a change in capacitance between the function selection terminals.

4. An electronic apparatus as in claim 1, wherein the signal specifying to the switching circuit the functional unit to be connected to the connection means is generated according to a change in resistance between the function selection terminals.

5. An electronic apparatus comprising:
a connection means for connecting to an external device;
a plurality of functional units, each of which executes at least one particular function;
a switching circuit that selectively connects at least one of the plurality of functional units to the connection means;
function selection terminals connected to the switching circuit, the function selection terminals outputting to the switching circuit a signal specifying the at least one functional unit to be connected to the connection means; and
a signal determination means for determining the signal that is output from the function selection terminals; and
wherein the signal specifying to the switching circuit the functional unit to be connected to the connection means is generated according to a change in an optical characteristic between function selection terminals.

6. An electronic apparatus as in claim 5, wherein the signal specifying to the switching circuit the functional unit to be connected to the connection means is generated according to a change in reflectivity between function selection terminals.

7. An electronic apparatus as in claim 5, wherein the signal specifying to the switching circuit the functional unit to be connected to the connection means is generated according to a change in refractive index between function selection terminals.

8. An electronic apparatus comprising:
a connection means for connecting to an external device;
a plurality of functional units, each of which executes at least one particular function;
a switching circuit that selectively connects at least one of the plurality of functional units to the connection means;
function selection terminals connected to the switching circuit, the function selection terminals outputting to the switching circuit a signal specifying the at least one functional unit to be connected to the connection means; and
a signal determination means for determining the signal that is output from the function selection terminals;
wherein the signal determination means is a member that adheres to the function selection terminals to determine a characteristic between the function selection terminals and thereby determine the signal output to the switching circuit; and
wherein the member comprises a visible identification pattern indicating the at least one functional unit connected to the connection means.

9. An electronic apparatus as in claim 8, wherein the identification pattern is a letter.

10. An electronic apparatus as in claim 8, wherein the identification pattern is a bar code.

11. An electronic apparatus comprising:
a connection means for connecting to an external device;
a plurality of functional units, each of which executes at least one particular function;
a switching circuit that selectively connects at least one of the plurality of functional units to the connection means;
function selection terminals connected to the switching circuit, the function selection terminals outputting to the switching circuit a signal specifying the at least one functional unit to be connected to the connection means; and
a signal determination means for determining the signal that is output from the function selection terminals;
wherein the signal determination means is a member that adheres to the function selection terminals to determine a characteristic between the function selection terminals and thereby determine the signal output to the switching circuit; and
wherein the member comprises a label.

12. A method for manufacturing an electronic apparatus comprising:
(a) producing a plurality of functional units, each of which executes at least one particular function;
(b) producing a connector that connects to an external device;
(c) producing lines connecting the connector to each of the plurality of functional units;
(d) cutting the lines connecting the connector to unnecessary functional units; and
step (c) produces the lines using semiconductor elements.
step (d) cuts the lines by destroying the semiconductor elements, and
step (c) produces the lines in a formation such that a pattern of lines cut by step (d) forms a readable identification pattern; and
wherein the identification pattern is a letter.

13. A method for manufacturing an electronic apparatus comprising;
(a) producing a plurality of functional units, each of which executes at least one particular function;

(b) producing a connector that connects to an external device;

(c) producing lines connecting the connector to each of the plurality of functional units;

(d) cutting the lines connecting the connector to unnecessary functional units; and step (c) produces the lines using semiconductor elements, step (d) cuts the lines by destroying the semiconductor elements, and step (c) produces the lines in a formation such that a pattern of lines cut by step (d) forms a readable identification pattern; and wherein the identification pattern is a bar code.

14. A method for manufacturing an electronic apparatus comprising:

(a) producing a plurality of functional units, each of which executes at least one particular function;

(b) producing a connector that connects to an external device;

(c) producing lines connecting the connector to each of the plurality of functional units;

(d) cutting the lines connecting the connector to unnecessary functional units; and wherein step (d) cuts the lines with a laser.

15. A method for manufacturing an electronic apparatus, comprising:

(a) producing a plurality of functional units, each of which executes at least one particular function;

(b) producing a connector that connects to an external device;

(c) producing a switching circuit that selectively connects at least one of the functional units to the connector;

(d) producing a phase change unit from a phase change material;

(e) producing a phase change detector connected to the switching circuit that detects a phase change of the phase change unit and outputs a result of the detection to the switching circuit; and (f) changing the phase of the phase change unit such that at least one of the functional units and the connector are connected by the switching circuit.

16. A method for manufacturing an electronic apparatus as in claim 15, wherein:

step (d) produces the phase change unit from a material that changes from a crystalline phase to an amorphous phase.

17. A method for manufacturing an electronic apparatus as in claim 15, wherein:

step (f) changes the phase of the phase change unit using laser beam emission.

18. A method for manufacturing an electronic apparatus as in claim 15, wherein:

step (f) changes the phase of the phase change unit using a thermal head.

19. A method for manufacturing an electronic apparatus as in claim 15, wherein:

step (d) produces the phase change unit from a material that changes from a crystalline phase to an isotropic liquid phase.

20. A method for manufacturing an electronic apparatus as in claim 15, wherein:

step (d) produces the phase change unit from a material in which phase change causes a change in dielectric constant; and step (e) produces the phase change detector with electrodes and the phase change unit disposed therebetween, a voltage applying circuit that applies a voltage between the electrodes, and a voltage rise detection circuit that detects a voltage rise between the electrodes.

21. A method for manufacturing an electronic apparatus as in claim 15, wherein:

step (d) produces the phase change unit such that the phase change pattern resulting from step (f) is a readable identification pattern.

22. A method for manufacturing an electronic apparatus as in claim 21, wherein the identification pattern is a letter.

23. A method for manufacturing an electronic apparatus as in claim 21, wherein the identification pattern is a bar code.

24. An electronic apparatus manufactured in accordance with the method comprising:

(a) producing a plurality of functional units, each of which executes at least one particular function;

(b) producing a connector that connects to an external device;

(c) producing lines connecting the connector to each of the plurality of functional units; and (d) cutting the lines connecting the connector to unnecessary functional units.

25. An electronic apparatus comprising:

a connector that connects to an external device;

a plurality of functional units, each of which executes at least one particular function;

a switching circuit that selectively connects at least one of the plurality of functional units to the connector;

function selection terminals connected to the switching circuit, the function selection terminals outputting to the switching circuit a signal specifying the at least one functional unit to be connected to the connector; and a signal determination unit that determines the signal that is output from the function selection terminals; and wherein the signal specifying to the switching circuit the functional unit to be connected to the connector is generated according to a change in an electrical characteristic between the function selection terminals.

26. An electronic apparatus as in claim 25, wherein the signal specifying to the switching circuit the functional unit to be connected to the connector is generated according to conductivity between the function selection terminals.

27. An electronic apparatus as in claim 25, wherein the signal specifying to the switching circuit the functional unit to be connected to the connector is generated according to a change in capacitance between the function selection terminals.

28. An electronic apparatus as in claim 25, wherein the signal specifying to the switching circuit the functional unit to be connected to the connector is generated according to a change in resistance between the function selection terminals.

29. An electronic apparatus comprising:

a connector that connects to an external device;

a plurality of functional units, each of which executes at least one particular function;

a switching circuit that selectively connects at least one of the plurality of functional units to the connector;

function selection terminals connected to the switching circuit, the function selection terminals outputting to the switching circuit a signal specifying the at least one functional unit to be connected to the connector; and a signal determination unit that determines the signal that is output from the function selection terminals; and wherein the signal specifying to the switching circuit the functional unit to be connected to the connector is generated according to a change in an optical characteristic between function selection terminals.

30. An electronic apparatus as in claim 29, wherein the signal specifying to the switching circuit the functional unit to be connected to the connector is generated according to a change in reflectivity between function selection terminals.

31. An electronic apparatus as in claim 29, wherein the signal specifying to the switching circuit the functional unit to be connected to the connector is generated according to a change in refractive index between function selection terminals.

32. An electronic apparatus comprising:

a connector that connects to an external device;

a plurality of functional units, each of which executes at least one particular function;

a switching circuit that selectively connects at least one of the plurality of functional units to the connector;

function selection terminals connected to the switching circuit, the function selection terminals outputting to the switching circuit a signal specifying the at least one functional unit to be connected to the connector; and a signal determination unit that determines the signal that is output from the function selection terminals;

wherein the signal determination unit is a member that adheres to the function selection terminals to determine a characteristic between the function selection terminals and thereby determine the signal output to the switching circuit; and wherein the member comprises a visible identification pattern indicating the at least one functional unit connected to the connector.

33. An electronic apparatus as in claim 32, wherein the identification pattern is a letter.

34. An electronic apparatus as in claim 32, wherein the identification pattern is a bar code.

35. An electronic apparatus comprising:

a connector that connects to an external device;

a plurality of functional units, each of which executes at least one particular function;

a switching circuit that selectively connects at least one of the plurality of functional units to the connector;

function selection terminals connected to the switching circuit, the function selection terminals outputting to the switching circuit a signal specifying the at least one functional unit to be connected to the connector; and a signal determination unit that determines the signal that is output from the function selection terminals;

wherein the signal determination unit is a member that adheres to the function selection terminals to determine a characteristic between the function selection terminals and thereby determine the signal output to the switching circuit; and wherein the member comprises a label.

* * * * *